(12) United States Patent
Lombard et al.

(10) Patent No.: US 6,949,817 B1
(45) Date of Patent: Sep. 27, 2005

(54) STACKABLE TEST APPARATUS FOR PROTECTING INTEGRATED CIRCUIT PACKAGES DURING TESTING

(75) Inventors: James H. Lombard, San Diego, CA (US); Timothy Scott Shook, Carlsbad, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 161 days.

(21) Appl. No.: 10/309,522

(22) Filed: Dec. 3, 2002

(51) Int. Cl.[7] .............................................. H01L 23/02
(52) U.S. Cl. ..................................... 257/686; 257/777
(58) Field of Search ....................... 317/100; 257/686, 257/390, 691, 777, 723, 773

(56) References Cited

U.S. PATENT DOCUMENTS 3,999,105 A  *  12/1976  Archey et al. ............... 361/700
4,174,424 A      11/1979  Jurva et al.
5,255,795 A      10/1993  Kitmitto
6,577,013 B1 *    6/2003  Glenn et al. ................. 257/777

OTHER PUBLICATIONS

MIL-STD-883E, Method 1014.10, Mar. 14, 1995, downloaded from the Internet, 12 pgs.

* cited by examiner

*Primary Examiner*—Michael Lebentritt
*Assistant Examiner*—Andre' Stevenson
(74) *Attorney, Agent, or Firm*—INCAPLAW; Terrance A. Meador

(57) ABSTRACT

A stackable test apparatus is disclosed including a body having a first surface with a raised portion extending from the first surface along a perimeter of the body and a plurality of stacking pins extending away from the first surface arraigned in a stacking pin pattern. Also included is a plurality of stacking pin receivers located on a second surface of the body, the stacking pin receivers arraigned in a pattern to match the stacking pin pattern and sized to accept the stacking pin.

10 Claims, 2 Drawing Sheets

Pressure Tank for Leak Testing

Pressure Tank for Leak Testing

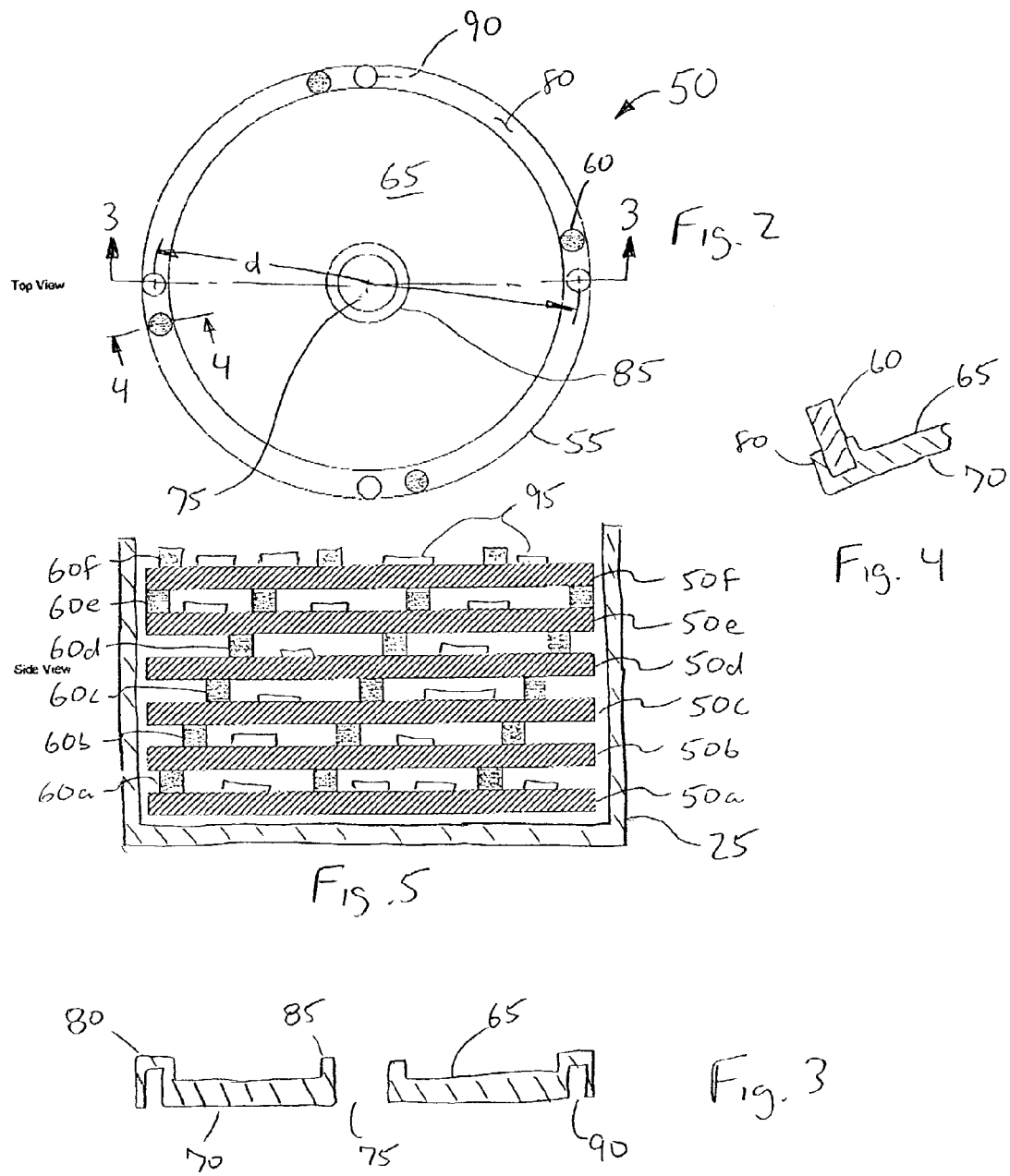

STACKABLE TEST APPARATUS FOR PROTECTING INTEGRATED CIRCUIT PACKAGES DURING TESTING

BACKGROUND OF THE INVENTION

1. Field of the Invention

The present invention relates generally to the testing of integrated circuit packages, and more particularly, to a stackable test apparatus that supports the integrated circuit packages during loading, testing and unloading in a pressurized test chamber.

2. Description of the Related Art

Hermetically sealed electronic packages, such as integrated circuits, are ordinarily subject to leak testing to evaluate the effectiveness of the hermetic seal. Generally, to leak test the electronic package, it is placed in a pressurized atmosphere of a test gas, such as helium, for a period of time to force the test gas into the hermetic container through any cracks or imperfections. Helium is preferred as the test gas since it has an extremely small molecule compared to most leakage opening sizes. The testing procedures or techniques are often determined by industry standards. One such test standard is MIL-STD-883, METHOD 1014, SEAL, which is incorporated by this reference. The purpose of this test is to determine the effectiveness (hermeticity) of the seal of microelectronic and semiconductor devices with designed internal cavities.

The fine leak test is conducted by placing a number of electronic packages into a test or "bombing" chamber. The chamber is then sealed and receives highly pressurized helium gas. The electronic packages are "bombed" with pressurized helium for a period of time such that the helium enters the package through any small cracks or leaks. The electronic packages are removed from the chamber and tested in a mass spectrometer fixture. The spectrometer measures the amount of helium that escapes from the electronic packages in terms of a flow rate. If the flow rate exceeds a certain minimum, then the electronic package fails. The spectrometer chamber is filled with ambient air and is not pressurized.

Usually, to maximize the number of electronic packages that can be tested, the chamber is filled as full as possible. Unfortunately, maximizing the loading of the electronic packages into the chamber sometimes causes damage due to mishandling and stacking of the electronic packages in the bomb chamber. The electronic packages suffer damage to the lids, pins, leads, and other fragile elements. The damaged electronic packages are either be scrapped or repaired, costing unnecessary time and money.

It would be advantageous to develop an apparatus that would reduce damage to the electronic packages while loading and unloading the electronic packages in a test chamber for testing.

It would be advantageous if the developed apparatus also would protect the electronic packages during testing in the test chamber. It also would be advantageous if the apparatus would protect the electronic packages during transportation to and from the test chamber.

It would also be advantageous if the developed apparatus does not interfere with the testing of the electronic packages or the test procedure.

SUMMARY OF THE INVENTION

The present invention is a stackable disk that protects integrated circuit boards or electronic packages during pressure testing in a pressurized tank or chamber. The stackable disk may also protect the electronic packages during transportation to and from the test chamber. The stackable disk is generally circular in shape with a flat upper surface with a raised edge portion around the perimeter. There may also be a center hole with a raised perimeter. When electronic packages are placed on the upper surface, the raised portions prevent the electronic packages from sliding for fall off. A plurality of stacking pins extends up from the upper surface. There are matching stacking pin holes on a surface so that when the disks are stacked, the staking pins from the lower disk mate with the staking pin holes of the upper disk.

BRIEF DESCRIPTION OF THE DRAWINGS

FIG. 2 is a plan view of the stackable test apparatus;

FIG. 3 is a sectional view at 2—2 of the stackable test apparatus;

FIG. 4 is a sectional view at 3—3 of the stackable test apparatus; and

FIG. 5 is a view of the stackable test apparatus in a test chamber.

DETAILED DESCRIPTION-OF THE PREFERRED EMBODIMENTS

Figure 1:
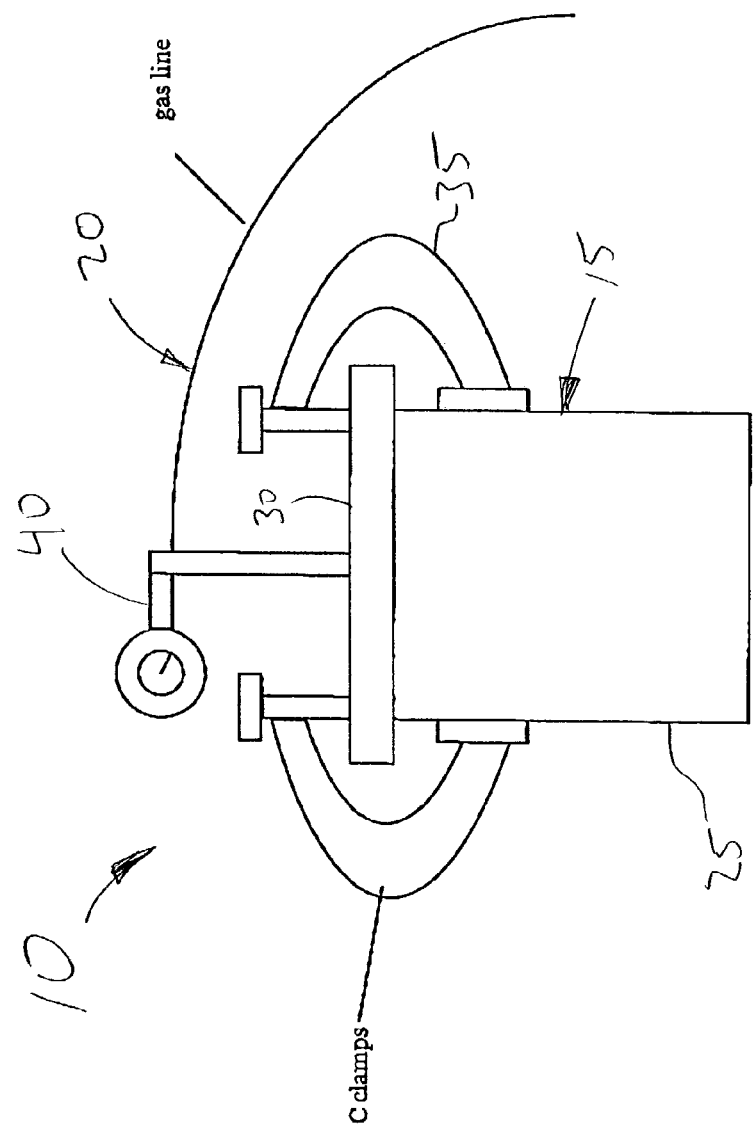
FIG. 1 shows an example of a fine leak test apparatus used for testing integrated circuit boards or electronic packages.

The present invention relates to a stackable test apparatus that supports integrated circuit boards or electronic packages during pressure testing in a pressurized chamber. There are a number of test procedures that test electronic packages in a chamber. For illustrative purposes, the present invention will be describe in relation to a fine leak test in a high pressure chamber using helium. The present invention is used to reduce damage to electronic packages when they are loaded or unloaded from the test high-pressure chamber and during the test itself.

FIG. 1 shows an example of a fine leak test apparatus 10 consisting of a pressure tank 15 connected to a supply of gas 20. The pressure tank 15 includes a chamber 25 with a sealable lid 30. The chambers 25 can be many sizes and shapes. One such chamber is similar in size to a paint can and holds roughly 200 electronic packages for testing. In this example, the lid 30 is held to that chamber 25 by "C" clamps 35. Other methods of holding the lid to the chamber may be used as long as it can be sealed and withstand the pressure. The pressure tank may also include a gauge 40 or other instrumentation to monitor the gas pressure during the fine leak test.

FIGS. 2–4 show a stackable test apparatus of the present invention, a stackable disk 50. The stackable test apparatus may be made up of one or more stackable disks. The stackable disk 50 serves as a platform for the electronic packages as they are loaded and unloaded from the test chamber and during the testing in the test chamber. The stackable disk 50 may also have additional uses, such as protecting the electronic packages during transportation to and from the test chamber, storing the electronic packages or supporting the electronic packages during other types of testing. The stackable disk 50 shown has a circular shaped protective tray 55 with a plurality of stacking pins 60. The tray 55 includes an upper surface 65 and lower surface 16. The upper 65 and lower 70 surfaces being generally flat. A hole 75 is positioned near the center of the protective tray 55. The upper surface 65 also includes a raised edge portion 80 near the perimeter of the tray 55 and a raised hole portion 85 around the perimeter of the hole 75. The electronic packages will be placed on the upper surface 65 prior to testing and the raised portions will help to retain and protect the electronic packages during testing.

The plurality of stacking pins 60 are located around the raised edge portion 80. While four stacking pins 60 are shown, other numbers of stacking pins would also work, such as three or more. Each pin 60 shown is positioned on a same diameter d and are equally spaced, in this case they are offset 90° from each other forming a pattern. While the figures show the tray 55 and the stacking pins 60 as separate components, in other embodiments the stacking pins 60 may be molded as part of the tray 55. On the lower side 70 of the tray 55 are a plurality of stacking pin holes 90. The number of stacking pin holes 90 usually match the number of stacking pins 60, are positioned in a pattern that matches the stacking pin 60 pattern and are sized to fit the pin 60. In this case, the stacking pin holes 90 are positioned on the same diameter d as the stacking pins 60 and are offset 90° from each other. As shown in the figures, while the pattern for the pins 60 and pin holes 90 are the same, but each pattern is rotated or offset a few degrees from each other so the pin 60 pattern and pin hole 90 pattern are not in the same location on the same tray 55.

The protective tray 55 is made from a material that is non-reactive to helium and is compatible with the electronic packages to be tested (i.e., will not harm the electronic packages). In addition, it would be desirable of the material were also water and moisture proof. Suitable materials include polyethylene, polypropylene, Teflon, or other suitable polymers or materials. The protective tray 55, and its features, may be molded or machined from the suitable material. Once the protective tray 55 is competed, the stacking pins 60 are attached, or molded, to form the stackable disk 50. As mentioned above, the size and shape of the stackable disk may vary to be compatible with the test chamber that it will be used in.

FIG. 5 shows the stackable test apparatus, in this case stackable disks 50a–50f, in a test chamber 25. Prior to insertion in the test chamber, the electronic packages 95 are placed on the protective tray 55a of the first stackable disk 50a. When the protective tray 55a is full, the next stackable disk 50b is place in top of stackable disk 50a, the pins 60a of stackable disk 50a aligning and inserting into the pin holes 90b of stackable disk 50b. The length of the pins 60 may vary, depending on the electronic package size. The pins 60 should be long enough so that when the next protective tray is positioned, it does not interfere with the electronic packages on the first protective tray. More electronic packages 95 are placed on the protective tray 55b until it is full, then another stackable disk 50c is placed on the second stackable disk 50b. And so on until all the protective trays 55 are full on the stackable disks 50a–50f. Alternatively, the electronic packages 95 may be placed on all of the stackable disks 50a–50f separately, and then the stackable disks 50a–50f are stacked on each other. This may be advantageous if the stackable disks 50 arrive at the test chamber with electronic packages 95 already in place. Then the stackable disks 50a–50f with the electronic packages 95 are inserted into the test chamber 25 and the test chamber 25 is sealed. In the figure shown, the test chamber 25 holds roughly 200 electronic packages 95 on 6 stackable disks 50a–50f.

The pressure tank 15 is then pressurized with gas 20, for example helium gas to 60 PSIG. The electronic packages 95 are "bombed" with the pressurized helium gas for a period of time, for example two hours, so that the helium inters the electronic packages 95 through any small cracks or leaks. The stackable disks 50 are designed not to interfere with the testing. To help equalize the helium pressure in the pressure tank 15, the stacking pins 60 are offset around the edge of the stackable disks 50 and the hole 75 is placed near the center. In some embodiments, it might be advantageous to have more than one hole per disk. In other embodiments, there may be no hole at all. Once the testing is completed, the stackable disks 50a–50f are removed from the test chamber 20, either one at a time or all at once. The stackable disks 50a–50f are them separated and the electronic packages 95 are removed from the protective tray 55 and sent for subsequent tests, such as a mass spectrometer leak tests. The mass spectrometer measures the amount of helium that escapes from the package in terms of flow rate. If the flow rate exceeds a certain minimum, for example more than $5 \times 10^{-8}$ ATM CC/SEC, then the electronic package fails.

Typical electronic packages 95 are fragile and can be easily damaged during movement, such as loading or unloading in a test chamber. The electronic packages 95 are usually made of ceramic material that can be cracked and suffer damage to the lids, pins, leads and other fragile elements. This damage leads to high yield losses with the electronic packages receiving additional rework, or if damage is severe enough, being scrapped. The stackable disk 50 may protect the electronic packages 95 prior to testing, during loading into the test chamber, while testing in the test chamber, during removal from the test chamber and any subsequent movements prior to the next test. This protection of the electronic packages saves time and money by reducing damage to electronic packages.

It is to be understood that the above is merely a description of preferred embodiments of the invention and that various changes, alterations, and variations may be made without departing from the true spirit and scope of the invention as set for in the appended claims. None of the terms or phrases in the specification and claims has been given any special particular meaning different from the plain language meaning to those skilled in the art, and therefore the specification is not to be used to define terms in an unduly narrow sense.

What is claimed is:

1. A stackable test apparatus for protecting electronic packages, comprising:
   a body having a shape with a first surface and a second surface, a raised portion extending from the first surface along a perimeter of the body;
   the body material being selected from the group of materials consisting of polyethylene, polypropylene, Teflon and other suitable polymers; and
   a plurality of stacking pins extending away from the first surface arraigned in a stacking pin pattern;
   the stacking pins being made from the same material as the body.

2. The test apparatus of claim 1 further comprising a plurality of stacking pin receivers located on the second surface, the stacking pin receivers arraigned in a pattern to match the stacking pin pattern and sized to accept the stacking pin.

3. The test apparatus of claim 1 wherein the stacking pins are located on the raised portion.

4. The test apparatus of claim 1 wherein the shape is a disk shape.

5. The test apparatus of claim 4 wherein the disk shape has a hole near a center and a second raised portion around a perimeter of the hole.

6. The test apparatus of claim 1 wherein the body and stacking pins are molded together.

7. A stackable disk apparatus for protecting electronic packages, comprising:
- a disk shaped body having a first surface and a second surface, a raised portion extending from the first surface along a perimeter of the body;
- the disk shaped body material being selected from the group of materials consisting of polyethylene, polypropylene, Teflon and other suitable polymers;
- a plurality of stacking pins extending away from the first surface arraigned in a stacking pin pattern;
- the stacking pins being made from the same material as the body; and
- a plurality of stacking pin receivers located on the second surface, the stacking pin receivers arraigned in a pattern to match the stacking pin pattern and sized to accept the stacking pins.

8. The stackable disk of claim 7 wherein the stacking pins are located on the raised portion.

9. The stackable disk of claim 7 wherein the disk shaped body has a hole near a center and a second raised portion around a perimeter of the hole.

10. The stackable disk of claim 7 wherein the body and stacking pins are molded together.

* * * * *